United States Patent [19]

Jang

[11] Patent Number: 5,399,520

[45] Date of Patent: Mar. 21, 1995

[54] METHOD FOR THE FORMATION OF FIELD OXIDE FILM IN SEMICONDUCTOR DEVICE

[75] Inventor: Se A. Jang, Bubaleub, Rep. of Korea

[73] Assignee: Hyundai Electronics Industries Co., Ltd., Bubaleub, Rep. of Korea

[21] Appl. No.: 220,098

[22] Filed: Mar. 30, 1994

[30] Foreign Application Priority Data

Mar. 31, 1993 [KR] Rep. of Korea ............... 1993-5468

[51] Int. Cl.⁶ ........................................... H04L 21/76
[52] U.S. Cl. ..................................... 437/67; 437/69; 437/72; 437/73; 148/DIG. 50
[58] Field of Search ................. 437/67, 72, 73, 69, 437/242; 148/DIG. 50

[56] References Cited

U.S. PATENT DOCUMENTS

| | | | |
|---|---|---|---|
| 4,363,868 | 12/1982 | Takasaki et al. | 437/239 |
| 4,398,992 | 8/1983 | Fang et al. | 437/72 |
| 4,561,172 | 12/1985 | Slawinski et al. | 437/67 |
| 4,923,563 | 5/1990 | Lee | 437/72 |
| 5,229,318 | 7/1993 | Straboni et al. | 437/67 |
| 5,248,350 | 9/1993 | Lee | 437/72 |
| 5,298,451 | 3/1994 | Rao | 437/72 |

FOREIGN PATENT DOCUMENTS

| | | | |
|---|---|---|---|
| 0075875 | 4/1983 | European Pat. Off. | 437/72 |
| 0247051 | 11/1986 | Japan | 437/72 |
| 0299361 | 12/1988 | Japan | 437/67 |
| 0234145 | 8/1992 | Japan | 437/67 |
| 0206263 | 8/1993 | Japan | 437/67 |

OTHER PUBLICATIONS

Teng et al., "Optimization of Sidewall Masked Isolation Process", IEEE Journal of Solid-State Circuits, vol. 20, No. 1, Feb. 1985, pp. 44–51.

Primary Examiner—Brian E. Hearn
Assistant Examiner—Trung Dang
Attorney, Agent, or Firm—Darby & Darby

[57] ABSTRACT

There are disclosed methods for the formation of field oxide film in a semiconductor device. By the methods, a field oxide film which plays a role of insulation for the separation of device, is formed in a trench formed in a semiconductor substrate. In the methods, an oxide-nitride film is utilized as an oxidation protective film which prevents a pad oxide film and the side well of the trench from being oxidized. As a result, the bird's beak is reduced, which allows to secure the active region more large. In addition, the methods make the field oxide film smooth. Furthermore, increasing the threshold voltage of a field, the field oxide film is superior in punchthrough characteristics. Accordingly, the methods can be applied to fabricate highly integrated semiconductor devices.

8 Claims, 9 Drawing Sheets

METHOD FOR THE FORMATION OF FIELD OXIDE FILM IN SEMICONDUCTOR DEVICE

BACKGROUND OF THE INVENTION

1. Field of the invention

The present invention relates, in general, to methods for the formation of device separation film among manufacture processes for a semiconductor device and, more particularly, to methods for forming a field oxide film in the semiconductor device, capable of securing an active region more large and smoothing the surface of the field oxide film.

2. Description of the Prior Art

For better understanding of the background of the present invention, there will be described a conventional method for the formation of device separation film in a semiconductor device along with its problems.

Referring initially to FIG. 1A, there is schematically illustrated the conventional method for forming a field oxide film in a semiconductor device. As shown in this figure, a silicon substrate 1 is covered with a pad oxide film 2, which is subsequently overlaid with a first nitride film 3. An etching process is carried out to open a predetermined portion of the nitride film 3 in which a field oxide film is to be formed, leaving a pattern of the nitride film 3. Thereafter, on the opened portion, there is deposited a second nitride film, which is subsequently subjected to etch back, so as to form a spacer nitride film 6 at either side wall thereof. Using the spacer nitride film 6 and the first nitride film 3 as an etch mask, a trench 7 is formed in the silicon substrate 1.

Now, referring to Fig. 1B, there is a schematic view showing a field oxide film 10 which is formed by applying an oxidation process to the structure resulting from FIG. 1A. While the field oxide film 10 is being formed, oxygens are diffused through the pad oxide film 2, oxidizing a part of the silicon substrate 1. Accordingly, as shown in FIG. 1B, ears C of the field oxide film 10 are generated and bird's beaks form thick in the active region.

These ears and the bird's beaks formed at the-field oxide film 10 not only reduce the area of the active region but also make the surface of the field oxide film rough, causing various difficulties in performing subsequent processes.

SUMMARY OF THE INVENTION

For solving the above problems encountered in prior arts, the present inventors have recognized that there exists a need for a novel method for the formation of field oxide film in a semiconductor device superior in device separation characteristics.

Accordingly, it is an object of the present invention to provide methods for the formation of field oxide film in a semiconductor device, capable of diminishing the factors of generating the bird's beak so as to obtain active region more large in the device.

It is another object of the present invention to provide methods for the formation of field oxide film in a semiconductor device, capable of making the surface of the field oxide film smooth.

It is a further object of the present invention to provide methods for the formation of field oxide film in a semiconductor device, effective for the subsequent processes for fabricating the semiconductor device.

In accordance with an embodiment of the present invention, the above objects can be accomplished by providing a method for the formation of field oxide film, comprising the steps of: covering a semiconductor substrate with a pad oxide film; annealing the pad oxide film, so as to form a first oxide-nitride film; overlaying the first oxide-nitride film with a polysilicon film and a first nitride film, in due order; etching the first nitride film and the polysilicon film, to form a hole exposing a predetermined portion of the first oxide-nitride film, and depositing a second nitride film entirely over the resulting structure; subjecting the second nitride film to etch back, so as to form a spacer nitride film at either side wall of the hole, and applying an etch process to the predetermined portion, so as to form a trench in the semiconductor substrate, the spacer nitride film and the first nitride film serving as an etch mask; annealing the trench to grow a second oxide-nitride film both from the bottom and from the side wall of the trench; and removing only the second oxide-nitride film formed on the bottom of the trench by use of etching, and forming a field oxide film in the trench.

In accordance with another embodiment of the present invention, the above objects can also be accomplished by providing a method for the formation of field oxide film in a semiconductor device, comprising the steps of: forming a pad oxide film, a polysilicon film and a first nitride film on a semiconductor substrate, in due order; etching the first nitride film and the polysilicon film, to form a hole exposing a predetermined portion of the pad oxide film covering the semiconductor substrate, and depositing a second nitride film entirely over the resulting structure; subjecting the second nitride film to etch back, so as to form a spacer nitride film at either side wall of the hole, and applying an etch process to the predetermined portion, so as to form a trench in the semiconductor substrate, the spacer nitride film and the first nitride film serving as an etch mask; annealing the trench to grow a second oxide-nitride film both from the bottom and from the side wall of the trench; and removing only the second oxide-nitride film formed on the bottom of the trench by use of etching, and forming a field oxide film in the trench.

BRIEF DESCRIPTION OF THE DRAWINGS

The above objects and other advantages of the present invention will become more apparent by describing in detail the preferred embodiment of the present invention with reference to the attached drawings in which;

FIGS. 2A through 2I are partial cross sectional views showing a method for the formation of field oxide film in a semiconductor device, according to a first embodiment of the present invention;

DETAILED DESCRIPTION OF THE PREFERRED EMBODIMENTS

Figure 1A:
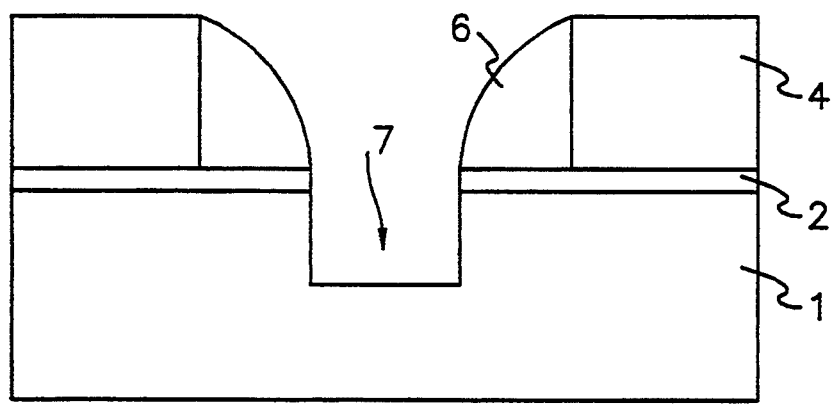
FIG. 1A is a partial cross sectional view showing a conventional method for the formation of field oxide film in a semiconductor device.
Figure 1B:
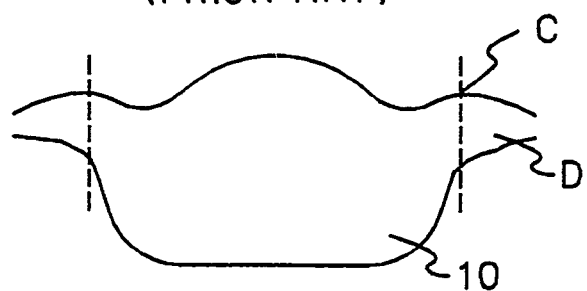
FIG. 1B is a schematic view showing the field oxide film formed according to the conventional method of FIG. 1A.

Hereinafter, the preferred embodiments of the present invention will be, in detail, described with reference to the accompanying drawings, wherein like reference numerals designate like parts, respectively.

Referring initially to FIGS. 2A through 2I, there is illustrated a method for the formation of field oxide film in a semiconductor device, according to a first embodiment of the present invention.

Figure 2A:
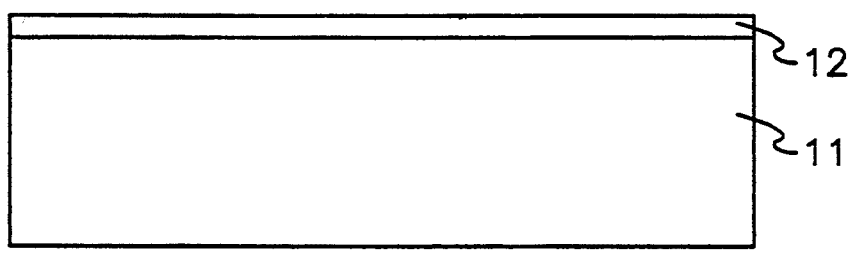

Firstly, as shown in FIG. 2A, a silicon substrate 11 is covered with a pad oxide film 12 with a thickness of approximately 50 to approximately 200 Å.

Figure 2B:
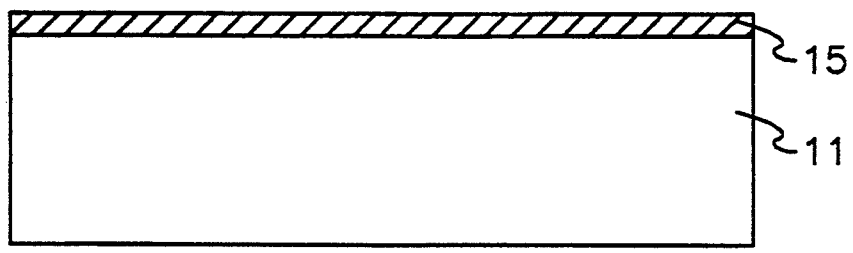

Under an atmosphere of ammonia (NH₃) or nitrous oxide (N₂O) gas, the pad oxide film 12 is subjected to annealing at a desired temperature, so as to grow an oxide-nitride film 15 in a thickness of approximately 50 to approximately 100 Å, as shown in FIG. 2B.

Figure 2C:
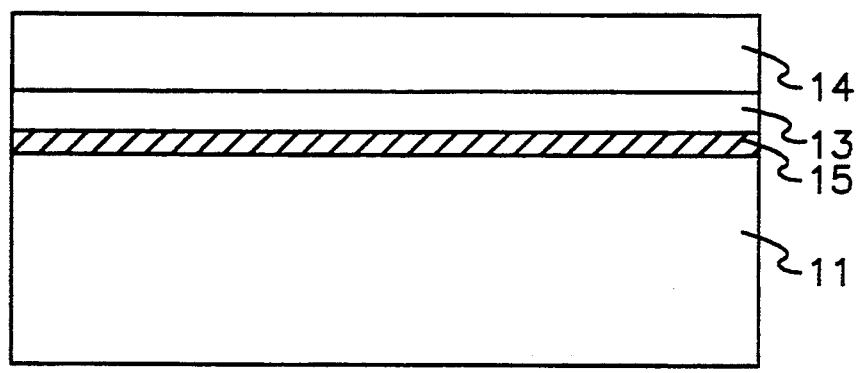

Subsequently, on the oxide-nitride film 15, there is deposited a polysilicon film 13, which is then overlaid with a first nitride film 14, as shown in FIG. 2C. At this time, while the thickness of the polysilicon film 13 is on the order of 200 to 500 Å, the nitride film 14 is 1,500 to 3,000 Å thick.

Figure 2D:
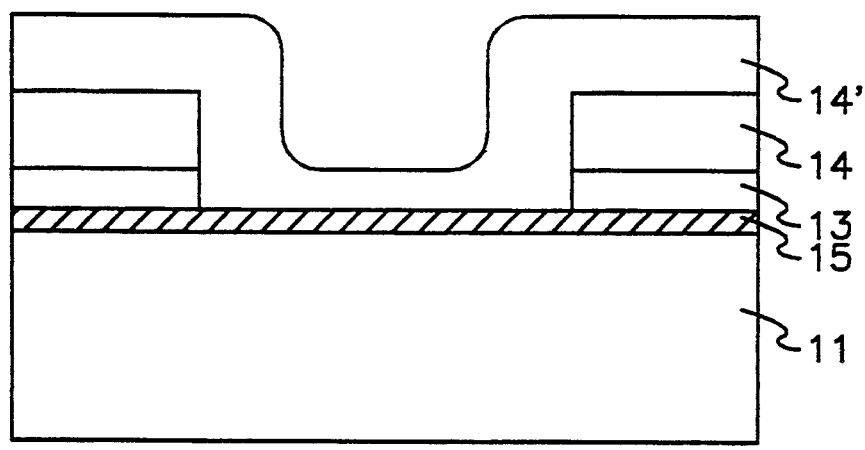

An etching process is applied to the first nitride film 14 and the polysilicon film 13 in due order, so as to open a predetermined portion in which a field oxide film is to be formed, and then, on the resulting structure, there is formed a second nitride film 14' in thicknesses ranging from approximately 1,500 to approximately 2,000 Å, as shown in FIG. 2D.

Figure 2E:
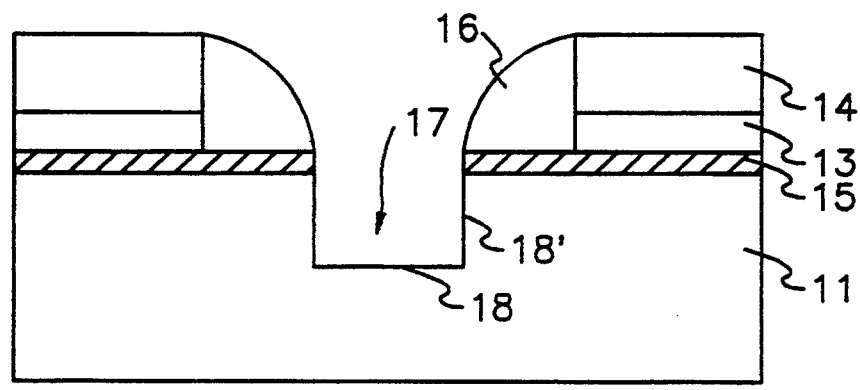

Following this, the second nitride film 14' is subjected to etch back, so as to form a spacer nitride film 16 at either side wall of the opened portion, and using the spacer nitride film 16 and the first nitride film 14 as an etch mask, an etching process is applied to the oxide-nitride film 15 and the silicon substrate 11 of the predetermined portion, so as to form a trench 17 in said silicon substrate which is approximately 500 to 1,000 Å deep, as shown in FIG. 2E.

Figure 2F:
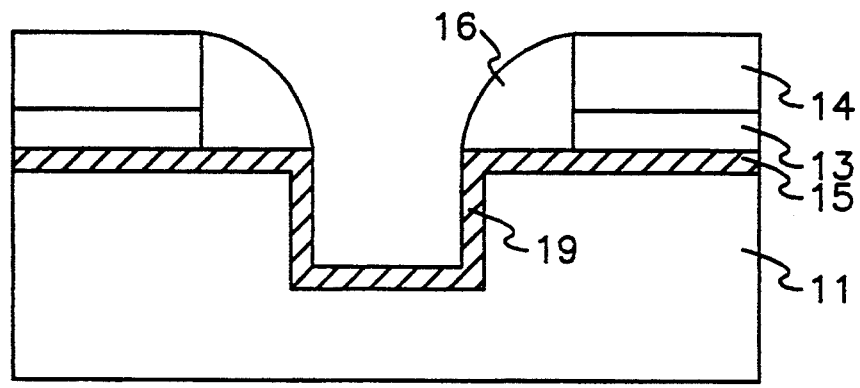

Thereafter, the trench 17 is annealed in an atmosphere of ammonia (NH₃) or nitrous oxide (N₂O) gas, to grow a second oxide-nitride film 19 in a thickness of approximately 50 to approximately 100 Å both from the bottom 18 and from the side wall 18' of the trench 17, as shown in FIG. 2F.

Figure 2G:
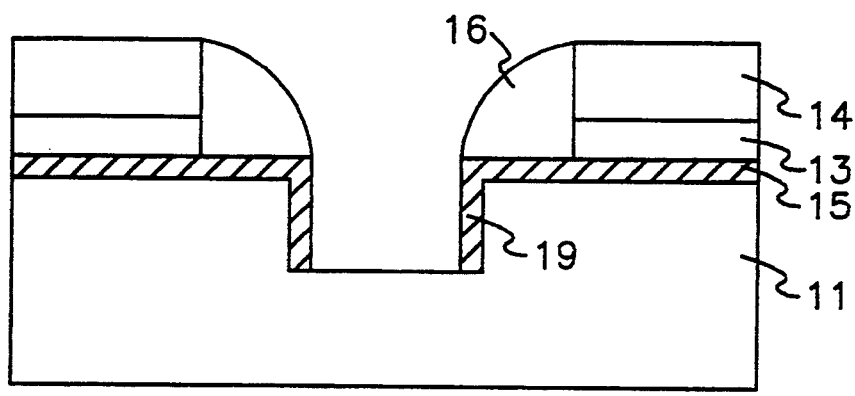

Other etching process is again carried out, so as to remove the oxide-nitride film 19 grown from only the bottom 18, as shown in FIG. 2G.

Figure 2H:
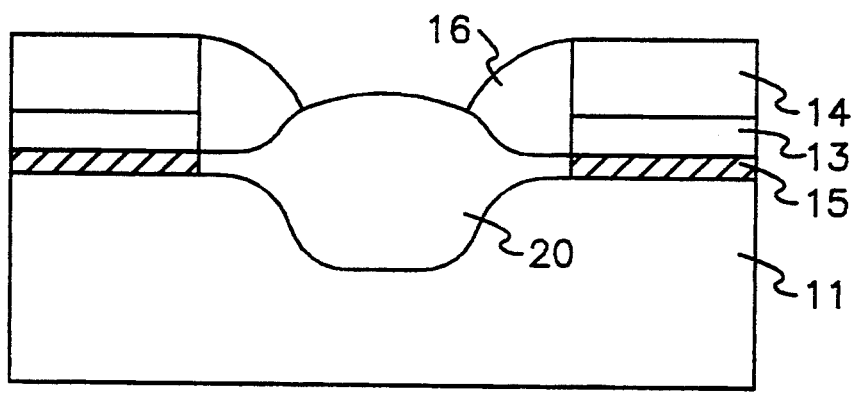
Figure 21:
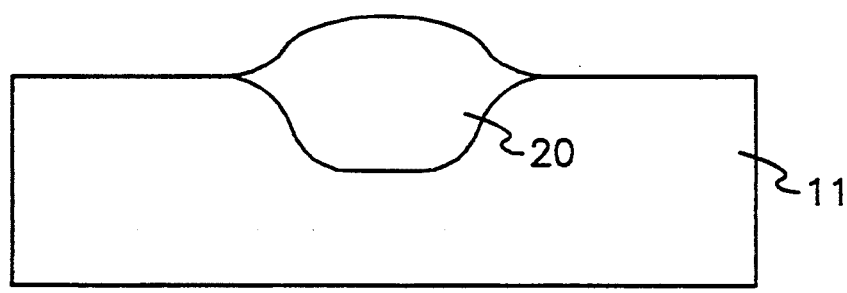

At long last, the field oxide film 20 is formed in the trench 17, as shown in FIG. 2H, which is completed by planarization.

In advance of the planarization, remaining films, such as the first nitride film 14, the spacer nitride film 16, the polysilicon film 13 and the first oxide-nitride film 15, are removed, as shown in FIG. 2I.

Referring now to FIGS. 3A through 3G, there is illustrated a method for the formation of field oxide film in a semiconductor device, according to a second embodiment of the present invention.

Figure 3A:
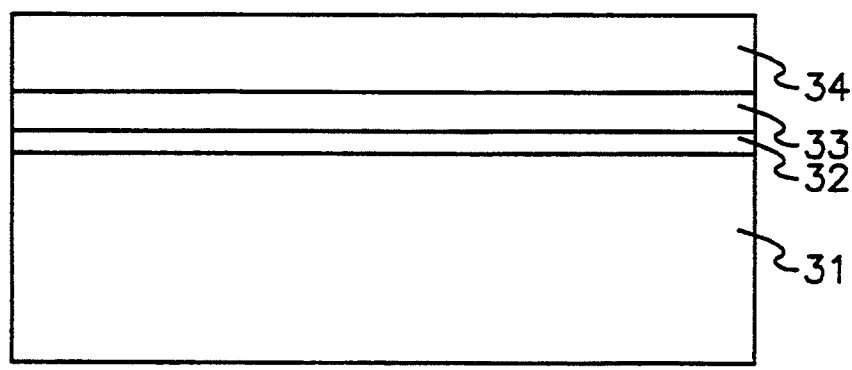
FIGS. 3A through 3G are partial cross sectional views showing a method for the formation of field oxide film in a semiconductor device, according to a second embodiment of the present invention.

Firstly, as shown in FIG. 3A, a silicon substrate 31 is covered with a pad oxide film 32 having thicknesses ranging from approximately 50 to approximately 200 Å, which is then overlaid with a polysilicon film 33 and a first nitride film 34 in due order, as shown in FIG. 3A. At this time, the polysilicon film 33 is approximately 200 to approximately 500 Å thick, whereas the first nitride film 34 is approximately 1,500 to approximately 3,000 Å thick.

Figure 3B:
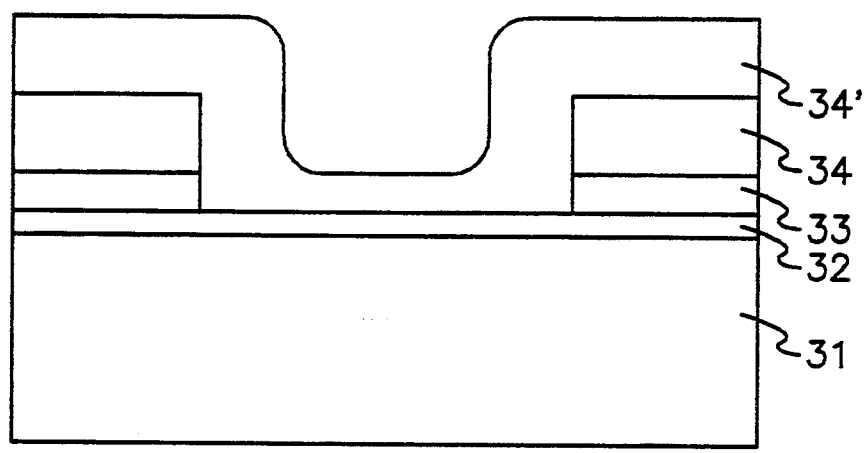

A dry etching process is applied to the first nitride film 34 and the polysilicon film 33 in due order, so as to open a predetermined portion in which a field oxide film is to be formed, and then, on the resulting structure, there is formed a second nitride film 34' in thicknesses ranging from approximately 1,500 to approximately 2,000 Å, as shown in FIG. 3B.

Figure 3C:
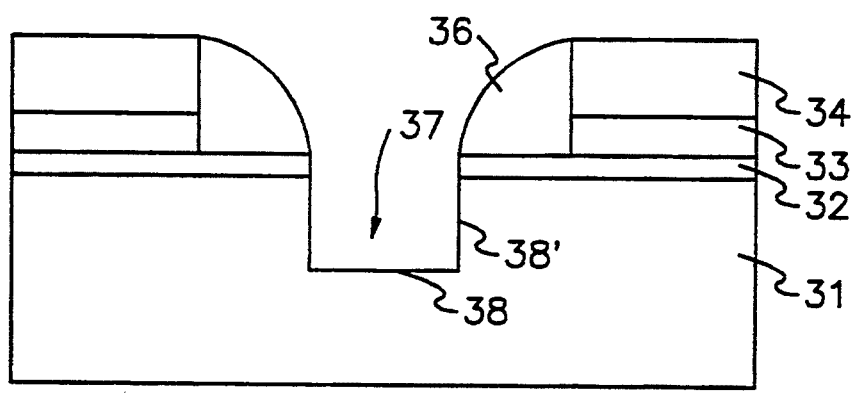

Following this, the second nitride film 34' is subjected to etch back, so as to form a spacer nitride film 36 at either side wall of the opened portion, and using the spacer nitride film 36 and the first nitride film 34 as an etch mask, an etching process is applied to the pad oxide film 32 and the silicon substrate 31 of the predetermined portion, so as to form a trench 37 which is approximately 500 to 1,000 Å deep, as shown in FIG. 3C.

Figure 3D:
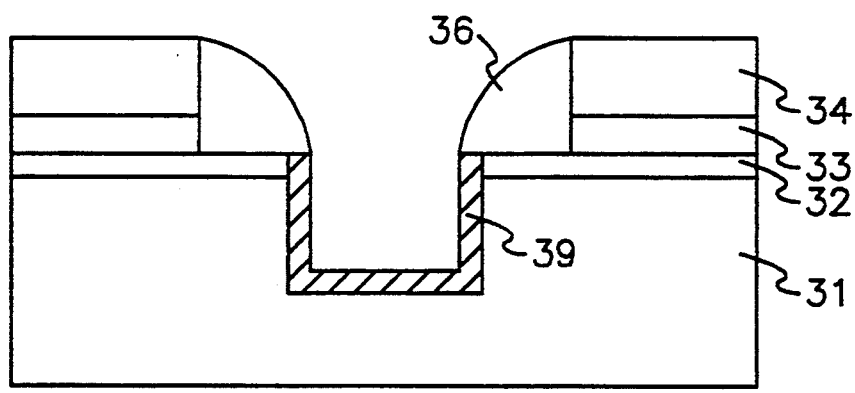
Figure 3E:
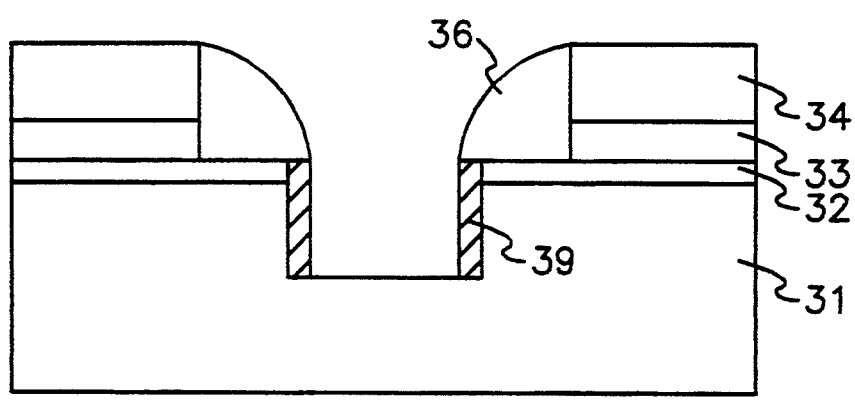
Figure 3F:
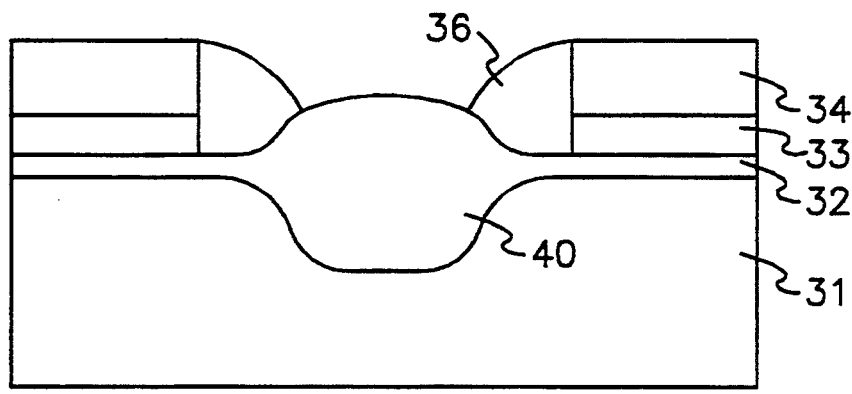
Figure 3G:
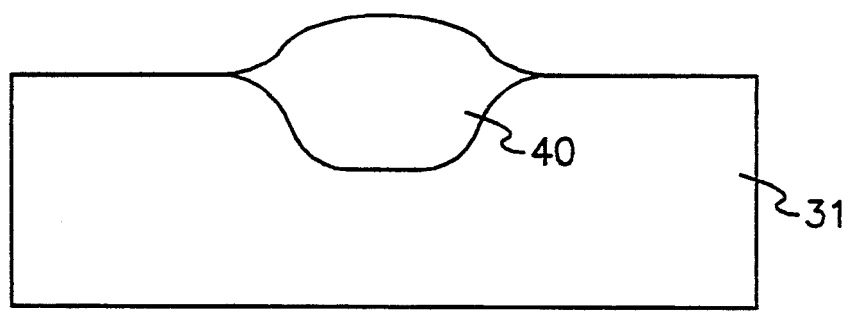

Thereafter, the trench 37 is annealed in an atmosphere of ammonia (NH₃) or nitrous oxide (N₂O) gas, to grow an oxide-nitride film 39 to a thickness of approximately 50 to approximately 100 Å both from the bottom 38 and from the side wall 38' of the trench 37, as shown in FIG. 3D.

An etching process is carried out again, so as to remove the oxide-nitride film 39 grown only from the bottom 18, as shown in FIG. 2E.

Finally, the field oxide film 40 is formed in the trench 37, as shown in FIG. 2F, which is completed by planarization in back of removing remaining films, such as the first nitride film 34, the spacer nitride film 36, the polysilicon film 33 and the pad oxide film 32, as shown in FIG. 2G.

As described hereinafter, an oxide-nitride film is utilized as an oxidation protective film in the methods according to the present invention. This oxidation protective film effects anisotropic oxidation, preventing the pad oxide film and the side wall of the polysilicon substrate from being oxidized. As a result, the bird's beak is reduced, which allows to secure the active region more large.

In addition, the methods according to the present invention make the field oxide film smooth. Furthermore, increasing the threshold voltage of a field, the field oxide film is superior in punchthrough characteristics, in accordance with the present invention. Accordingly, the methods can be applied to fabricate highly integrated semiconductor devices.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for the formation of field oxide film in a semiconductor device, comprising the steps of:
    covering a semiconductor substrate with a pad oxide film;
    annealing said pad oxide film, so as to form a first oxide-nitride film;
    overlaying said first oxide-nitride film with a polysilicon film and a first nitride film, in due order;
    etching said first nitride film and said polysilicon film to form a hole exposing a predetermined portion of said first oxide-nitride film, and depositing a second nitride film entirely over the resulting structure;
    subjecting said second nitride film to etch back, so as to form a spacer nitride film at either side wall of said hole, and applying an etch process to said predetermined portion, so as to form a trench in said semiconductor substrate, said spacer nitride film and said first nitride film serving as an etch mask;

annealing said trench to grow a second oxide-nitride film from both the bottom and the side wall of said trench; and removing only the second oxide-nitride film formed on the bottom of said trench by use of etching, and forming a field oxide film in said trench.

2. A method according to claim 1, wherein said pad oxide film formed on said semiconductor substrate is approximately 50 to approximately 200 Å thick.

3. A method according to claim 1, wherein each of said first oxide-nitride film and said second oxide-nitride film is formed in thicknesses ranging from approximately 50 to approximately 100 Å in an atmosphere of ammonia ($NH_3$) or nitrous oxide ($N_2O$).

4. A method according to claim 1, wherein said trench is formed in depths ranging from approximately 500 to approximately 1,000 Å.

5. A method for the formation of field oxide film in a semiconductor device, comprising the steps of:

forming a pad oxide film, a polysilicon film and a first nitride film on a semiconductor substrate, in due order;

etching said first nitride film and said polysilicon film, to form a hole exposing a predetermined portion of said pad oxide film covering said semiconductor substrate, and depositing a second nitride film entirely over the resulting structure;

subjecting said second nitride film to etch back, so as to form a spacer nitride film at either side wall of said hole, and applying an etch process to said predetermined portion, so as to form a trench in said semiconductor substrate, said spacer nitride film and said first nitride film serving as an etch mask;

annealing said trench to grow a second oxide-nitride film from both the bottom and the side wall of said trench; and removing only the second oxide-nitride film formed on the bottom of said trench by use of etching, and forming a field oxide film in said trench.

6. A method according to claim 5, wherein said pad oxide film is formed in thicknesses ranging from approximately 50 to approximately 200 Å.

7. A method according to claim 5, wherein said trench formed in said semiconductor device is approximately 500 to approximately 1,000 Å deep.

8. A method according to claim 5, wherein said oxide-nitride film is formed in thicknesses ranging from approximately 50 to approximately 100 Å in an atmosphere of ammonia ($NH_3$) or nitrous oxide ($N_2O$).

* * * * *